United States Patent [19]
Wolfson et al.

[11] Patent Number: 4,596,208
[45] Date of Patent: Jun. 24, 1986

[54] CVD REACTION CHAMBER

[75] Inventors: Robert G. Wolfson, Concord; Stanley M. Vernon, Wellesley, both of Mass.

[73] Assignee: Spire Corporation, Bedford, Mass.

[21] Appl. No.: 667,989

[22] Filed: Nov. 5, 1984

[51] Int. Cl.⁴ ............................................. C23C 16/46
[52] U.S. Cl. ................................... 118/712; 118/724; 118/725; 118/730; 118/500; 118/733; 219/10.49 R; 219/10.67
[58] Field of Search ............... 118/730, 724, 725, 729, 118/728, 715, 712, 692, 733, 666, 500; 219/10.49 R, 10.67; 156/613, 614; 427/255.5

[56] References Cited

U.S. PATENT DOCUMENTS

| | | | |
|---|---|---|---|
| 3,364,084 | 1/1968 | Ruehrwein | 148/175 |
| 3,365,336 | 1/1968 | Folkmann et al. | 118/500 X |
| 3,690,290 | 9/1972 | Jarvela et al. | 118/730 |
| 3,885,061 | 5/1975 | Corboy et al. | 156/613 X |
| 4,147,571 | 4/1979 | Stringfellow et al. | 118/725 X |
| 4,468,283 | 8/1984 | Ahmed | 118/728 X |
| 4,522,149 | 6/1985 | Garbis | 118/500 X |

FOREIGN PATENT DOCUMENTS

| | | | |
|---|---|---|---|
| 56-48237 | 5/1981 | Japan | 118/715 |
| 56-152738 | 11/1981 | Japan | 118/692 |

OTHER PUBLICATIONS

Czorny "Epitaxy-A Versatile Tech. for Integrated Circuits" *RCA Engineer,* vol. 13, No. 3, Oct.-Nov. 1967, pp. 28-32.

P. Daniel Dapkus, "Metalorganic Chemical Vapor Deposition," Ann. Rev. Mater. Sci. 1982, 12: 243-269.

*Primary Examiner*—Bernard F. Plantz
*Attorney, Agent, or Firm*—Morse, Altman & Dacey

[57] ABSTRACT

An improved reaction chamber for CVD is disclosed that combines the advantageous features of the known horizontal and vertical designs while minimizing their respective short comings. The improved reaction chamber essentially comprises a vertical, double-walled reaction tube having a tapered top provided with a concentric gas inlet, a cooled base plate supporting the reaction tube and provided with a gas outlet, and a tapered susceptor operatively supported within the reaction tube, in close proximity to its tapered top and defining an angle therebetween. This angle varies from zero to about nineteen degrees and preferably is between ten to seventeen degrees. Preferably, the susceptor is rotatably and replaceably supported by a hollow rod, axially accommodating therein a thermocouple for monitoring the temperature within the reaction tube. The tapered top of the reaction tube can be shaped like a cone or like a pyramid with planar side surfaces.

9 Claims, 8 Drawing Figures

CVD REACTION CHAMBER

BACKGROUND OF THE INVENTION

1. Field Of The Invention

The present invention relates generally to reaction chambers for chemical vapor deposition (CVD) and, more particularly, to an improved CVD reaction chamber characterized by optimized gas flows, improved materials utilization and a maximized deposition area.

2. The Prior Art

In the late 1950's, Ruehrwein invented a process for the production and deposition of high purity epitaxial films of large single crystals of inorganic compounds onto substrates by a high temperature vapor-phase reaction in the presence of hydrogen. See the U.S. Pat. No. 3,364,084. Since then, the epitaxial growth of compound semiconductors utilizing organometallic compounds has become widespread in high performance electronic and optoelectronic devices. Metalorganic chemical vapor deposition (MOCVD) generally refers to the deposition of multiconstituent films, whether epitaxial, polycrystalline or amorphous, employing any of several metalorganic compounds for the source of one or more of the constituents. In the epitaxial deposition field, many workers prefer to call this technology organometallic vapor-phase epitaxy (OMVPE). In all cases, the vapor-phase reaction takes place in a reactor having a heated susceptor and a thereon disposed substrate. In the reactor, the organometallic compounds are pyrolized by the heat of the susceptor and the substrate to form the respective atomic or molecular forms of the constituents, which constituents recombine to form the semiconductor films on the substrate.

Two basic types of reactor geometries have been used in the MOCVD growth of compound semiconductors: horizontal and vertical. The flow patterns and the resultant wafer growth characteristics of these two different designs differ markedly. In a horizontal reactor design, the flow is highly laminar. Such a laminar, displacement mode of operation results in well-characterized flow, temperature and reactant concentration gradients over the susceptor which, in addition to being well defined, vary systematically in the direction of the flow. Horizontal reactor designs lend themselves to abrupt changes in gas compositions, a most desired feature. FIG. 3 illustrates the gas flow patterns over a susceptor in a horizontal reactor geometry. A stagnant layer forms adjacent the susceptor where the flow rate is lower than that of the gas above this layer. The thickness of this stagnant layer increases with distance along the susceptor, with consequent depletion of the reactant species. This downstream depletion and temperature change result in corresponding concentration and thickness gradients with wafer position along the axial length of the horizontal reactor. Another stagnant zone in the horizontal reactor is created by the gases passing over the reactor tube surface. A vertical reactor, on the other hand, operates in a non-laminar, turbulent mode, precluding abrupt changes in gas compositions. A major drawback of the vertical design is its tendency to achieve non-uniform crystal growth over the entire susceptor surface. Further, the vertical design also suffers from lower throughput capability due to a small susceptor area limited by the cross section of the reaction tube. A further shortcoming of some vertical reactor designs resides in occasional prenucleation occurring in the gas phase. FIG. 4 illustrates a typical vertical reactor arrangement.

SUMMARY OF THE INVENTION

It is a principal object of the present invention to overcome the above disadvantages by providing an improved reaction chamber for CVD that combines the advantageous features of the known horizontal and vertical designs while at the same time minimizing their respective shortcomings.

More specifically, it is an object of the present invention to provide a reaction chamber for CVD comprising a vertical reaction tube having a tapered top provided with a concentric gas inlet, a bottom provided with a gas outlet, a base plate for supporting the reaction tube, and a tapered susceptor operatively supported within the reaction tube in close proximity to its tapered top and defining an angle therebetween. This angle varies from zero to about nineteen degrees and, preferably is between about ten to about seventeen degrees. Preferably, the susceptor is rotatably and replaceably supported within the reaction tube by a hollow rod, axially accommodating therein a thermocouple designed for monitoring the temperature of the susceptor during its operation. Preferably, the tapered top of the reaction tube is cone-shaped. It also can be pyramid-shaped, having a plurality of planar side surfaces. Preferably, the tapered susceptor also is cone-shaped. The tapered susceptor also can be pyramid-shaped, however. If the latter and so as further to increase its surface area when used in combination with a like pyramid-shaped reaction tube, the pyramid-shaped susceptor preferably is stationarily mounted within the pyramid-shaped tube of the reactor. In this case, the preferred angle between the tapered top of the reaction tube and the tapered susceptor varies between about twelve to about seventeen degrees. A pyramidal shape, whether for the tapered top or for the susceptor, can have anywhere from about four to about twelve planar side surfaces, with five-sided planar surfaces for the susceptor being preferred. Preferably, the susceptors either are provided with a plurality of pins or with a number of shallow recesses or with a combination thereof to accommodate a plurality of different-sized substrates thereon. In order to locate the pins on the susceptors and in various positions thereon, preferably a plurality of holes are formed on the susceptor surfaces.

Other objects of the present invention will in part be obvious and will in part appear hereinafter.

The invention accordingly comprises the improved reaction chamber for CVD of the present disclosure, its components, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENTS

Figure 1:
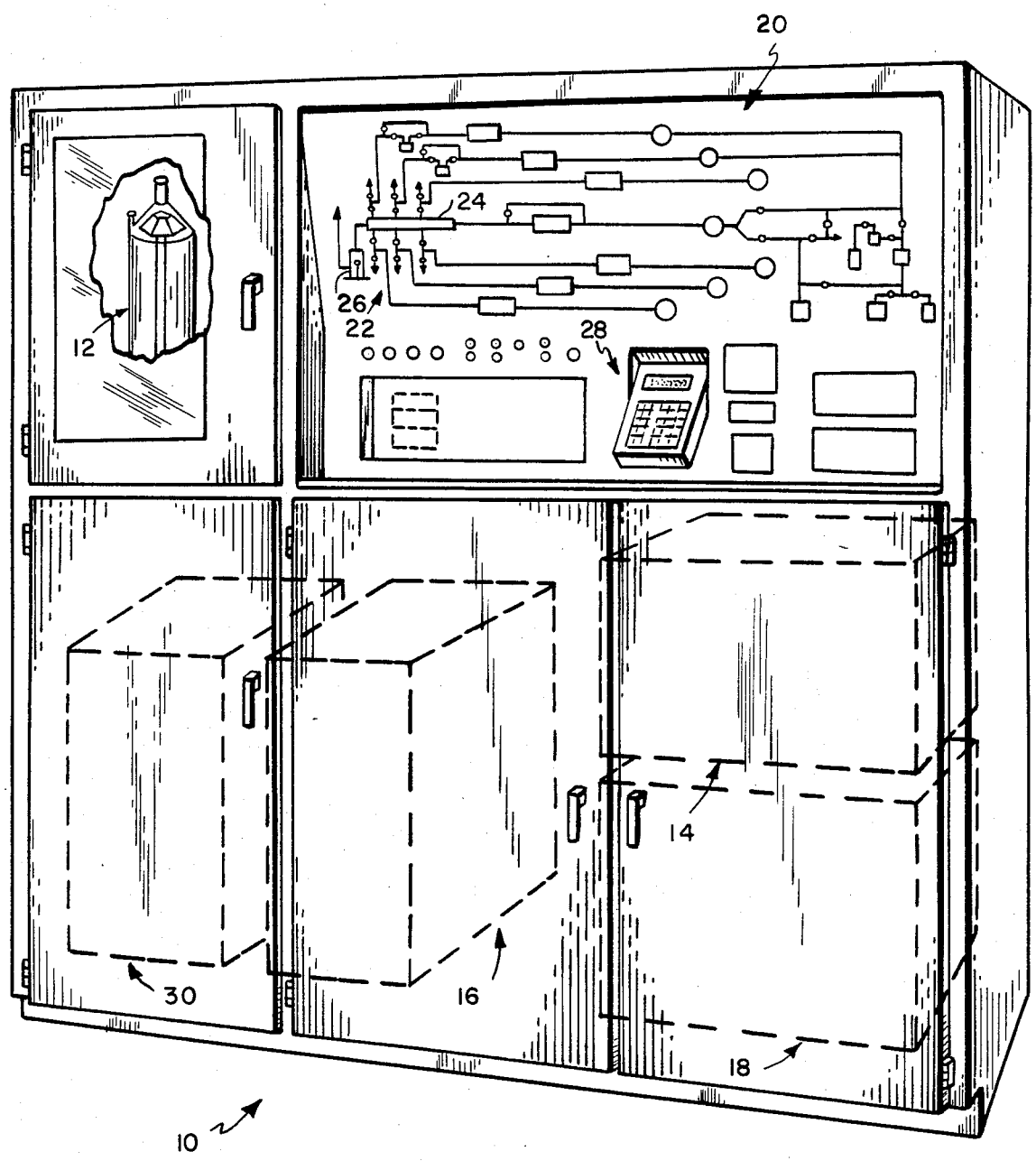
FIG. 1 is a frontal perspective and partly schematic view of reactor incorporating a reaction chamber for CVD, constructed in accordance with the present invention.

Generally, the illustrated embodiment of a metalorganic chemical vapor deposition (MOCVD) reactor 10 used in the growth of semiconductor materials and constructed in accordance with the present invention comprises a reaction chamber 12, a gas-mixing system 14 and a combination power supply and heat source 16. Preferably, the gas-mixing system 14 includes a fully automated gas manifold constructed from stainless steel tubing, pneumatically controlled bellows and valves, and electronic mass flow controllers. The mass flow rates and the sequencing of the valves preferably are under the control of a central microprocessor 18. Use of the microprocessor 18 permits the fully automated growth of even the most complex multilayer materials devices. The gas-mixing system 14 further includes a plurality of temperature controlled bubblers, also preferably made of stainless steel, to contain the various metalorganic Group III - V and Group II - VI compounds required to grow the desired structures. Such and further compounds are disclosed in the U.S. Pat. No. 3,364,084 that was granted to R. A. Ruehrwein on Jan. 16, 1968, the disclosure of which is incorporated herein by reference. The operation of the gas-mixing system 14 is controlled and monitored on a panel 20. The panel 20 displays, among others, a flow-chart 22, featuring lines and lights to indicate the admission of one or more of the illustrated six compounds, plus hydrogen, into an illustrated mixing manifold 24 prior to reaching an illustrated reactor tube 26. Inputs to the microprocessor 18 are given via a device 28 provided with a plurality of touch-sensitive buttons. The gas-mixing system 14 is designed to allow the growth of thin layers with abrupt transitions between the layers.

The combination power supply and heat source 16 includes the devices needed to power the radio frequency (RF) coils so as to inductively heat the susceptor in the reaction chamber 12. Susceptor temperature preferably is controlled by thermocouple feedback to the source 16.

The illustrated MOCVD reactor 10 also includes a vacuum system 30 to achieve the required vacuum within the reaction chamber 12.

Figure 3:
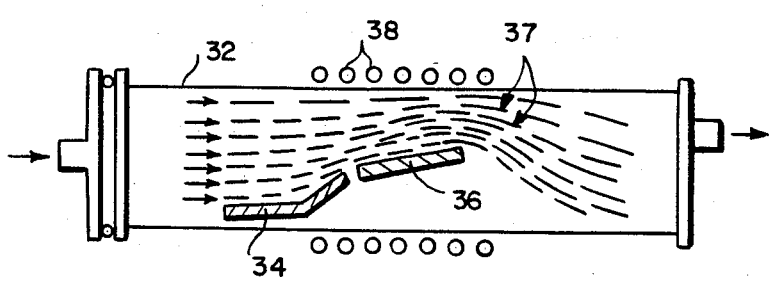
FIGS. 3 and 4 illustrate prior art reactor geometries.
Figure 4:
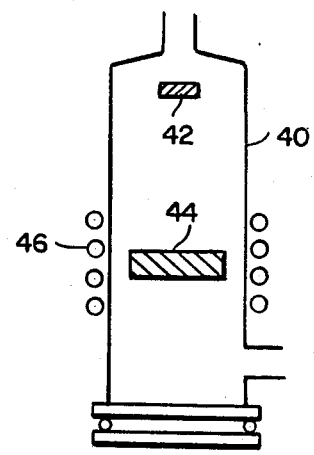

The two known prior art reactor geometries are illustrated in FIGS. 3 and 4. A schematic diagram of a horizontal reactor geometry is shown in FIG. 3 and it includes a tube 32, a baffle 34, a susceptor 36 and an RF coil 38. The gas flow patterns are illustrated by lines 37. A schematic diagram of a vertical reactor geometry is shown in FIG. 4 and it includes a tube 40, a baffle 42, a susceptor 44 and an RF coil 46. The respective advantages and shortcomings of these prior art reactor geometries already have been discussed above.

THE EMBODIMENT SHOWN IN FIG. 2

Figure 2:
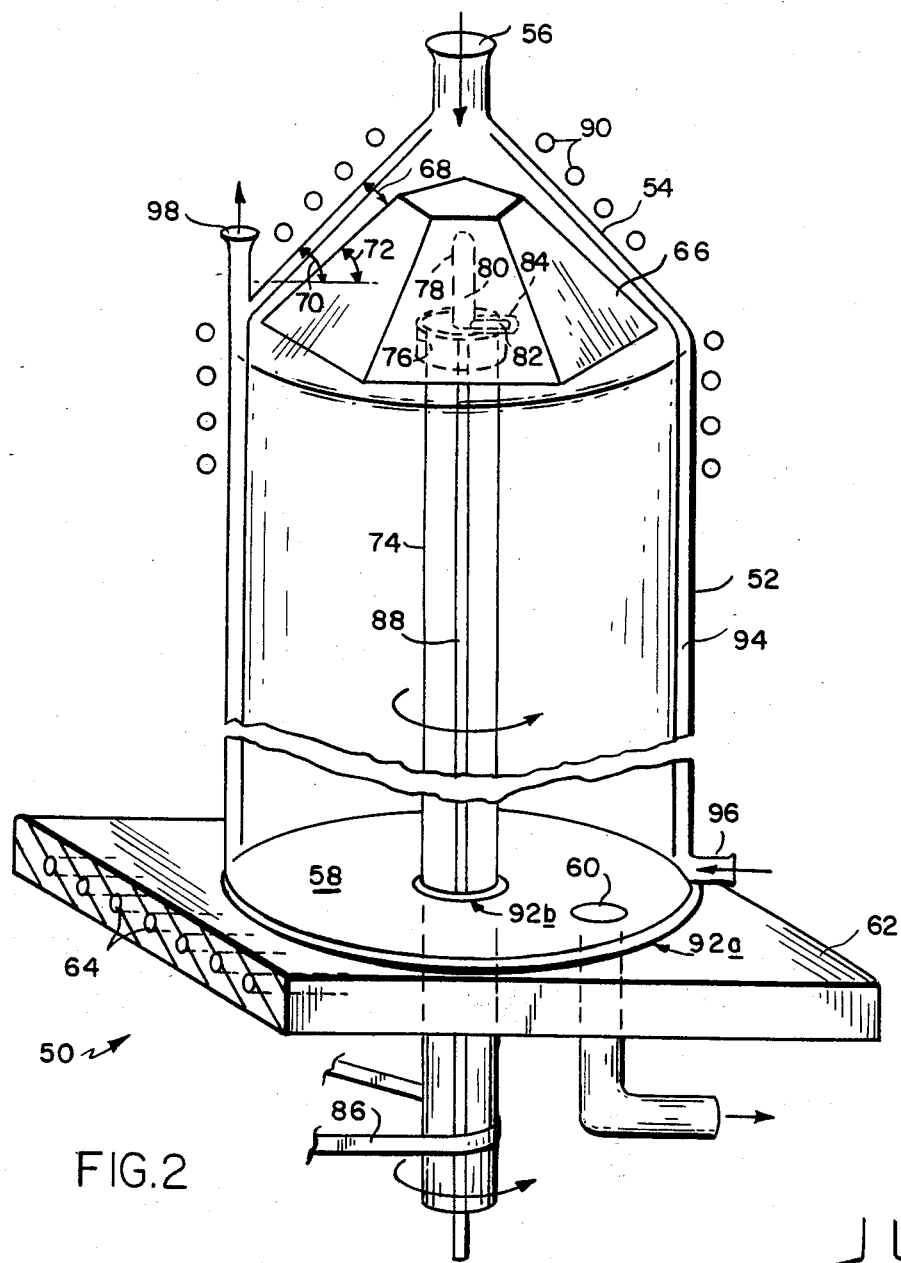
FIG. 2 is a schematic diagram of one preferred embodiment of a reaction chamber for CVD

A schematic diagram of one preferred embodiment of an improved reaction chamber 50 for the chemical vapor deposition (CVD) of multiple epitaxial layers and constructed in accordance with the invention is illustrated in FIG. 2. The reaction chamber 50 can be used in all reactor systems and with all known CVD chemistries, in addition to the preferred MOCVD reactor 10 described above with reference to FIG. 1.

The reaction chamber 50 essentially comprises a vertical double-walled reaction tube 52 having a tapered top 54 with a concentric gas inlet 56. Preferably, the reaction tube 52 is supported on or by a base plate 62, which also forms its bottom 58. The base plate 62 is provided with a gas outlet 60 and preferably also is provided with a plurality of channels 64 for circulating a coolant medium therethrough. A tapered susceptor 66 is operatively supported within the reaction tube 52, in close proximity to its tapered top 54 and defining an angle 68 therebetween. This angle 68 can vary from zero to about nineteen degrees, and preferably is somewhere between ten and seventeen degrees. Of course, the size of the angle 68 depends from a combination, namely on the respective sizes of an angle 70 of the tapered top 54 and of an angle 72 of the tapered susceptor 66. The more the former exceeds the latter, the greater will be the angle 68 therebetween. The angle 68 is selected on the basis of the hydrodynamic criteria for laminar flow and on the number and kinds of metalorganic componds used.

Preferably, the susceptor 66 is rotatably and replaceably supported within the reaction tube 52 by a hollow rod 74. To that end, preferably the underside of the susceptor 66 is formed with a cutout 76 having a deeper narrow section 78. In turn, the upper free end of the hollow rod 74 is formed with a correspondingly narrow portion 80. At the base of the narrow portion 80, there is formed a key 82 to fit within a key way 84 formed in the susceptor 66. Consequently, rotational displacement of the hollow rod 74, imparted thereto in any convenient manner, as for example by a drive belt 86, will also rotate the suceptor 66. Preferably, the susceptor 66 is rotated at a speed from about two rpm to about four rpm. Within the hollow rod 74, there is disposed a thermocouple 88 along its axial length. The thermocouple 88 is designed for monitoring the temperature prevailing within the reaction tube 52 during its operation. To this end, the thermocouple 88 is coupled to the combination power supply and heat source 16 to provide the necessary feedback thereto. An RF coil 90, also coupled to the combination power supply and heat source 16, provides induction heating to the susceptor 66.

In order to contain the very high operational temperatures, which may range between 400° and 1500° C., within the reaction tube 52, the same is built as a double-walled tube along most of its axial length, defining a self-contained annular chamber 94 therebetween. This annular chamber 94 preferably extends not only along the vertical length of the reaction tube 52 but also along its tapered top 54 up to where the top 54 meets the gas inlet 56. A coolant medium, preferably water, is conveniently admitted, for circulation in and through the annular chamber 94 via an inlet 96 provided near the bottom. A corresponding outlet 98 is provided topside of the tube 52 for withdrawing, on a continuous basis, the fluid medium from within the chamber 94.

Preferably, the tapered top 54 of the reaction tube 52 is conical in shape, while the tube 52 itself is cylindrical. The tapered susceptor 66 however, can have a variety of shapes, sizes and different surface areas. For it is the shape, the size and the particular surface area of the tapered susceptor 66, in combination with the angle 68 formed between the tapered top 54 and the tapered susceptor 66, that bear on the optimization of gas flows and of materials utilization as well as on the maximization of the effective deposition area of the susceptor. In the embodiment of FIG. 2, the tapered susceptor 66 is shown shaped like a pyramid having five planar side surfaces. The useful deposition area provided by this susceptor 66, as well as the ones hereinbelow described, is about 100 cm² for a reaction tube 52 with an inside diameter of about 10 cm. This deposition area has been found to be optimum for most current applications of the MOCVD reactor 10 design. It is pointed out that the tapered pyramidal shaped susceptor 66 can have anywhere from about four to about twelve planar side surfaces, although the illustrated five-sided shape is being preferred. It also is pointed out that the susceptor 66 is provided with a plurality of substrates, not shown, on which the actual growth of the metalorganic compounds takes place. These substrates can vary in size and shape so as to accommodate the growing of wafers of various sizes and shapes. These plurality of substrates either lie in shallow recesses in the susceptor 66 or are supported by pins whose positions on the susceptor 66 can be changed, as desired. This will become more evident from the description below.

The reaction tube 52 also is provided with appropriate seals, as at 92a and 92b, so as to hermetically seal off the tube 52 during its operational use.

THE EMBODIMENTS SHOWN IN FIGS. 5-7

Figure 5:
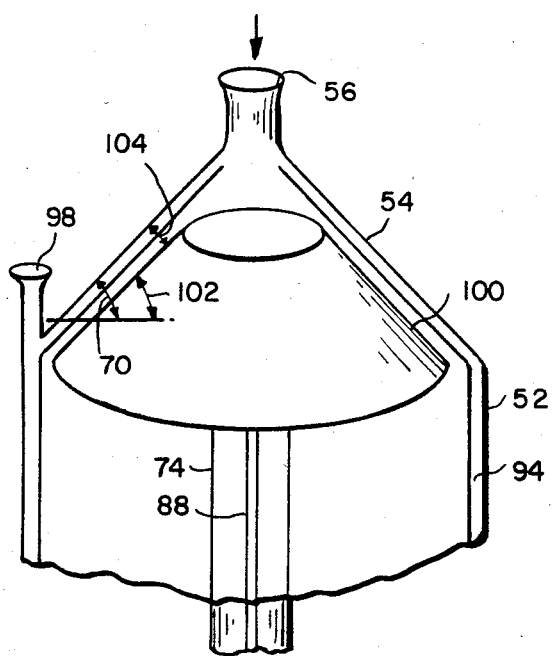
FIGS. 5–8 illustrate further preferred embodiments of reaction chambers for CVD according to the invention.
Figure 6:
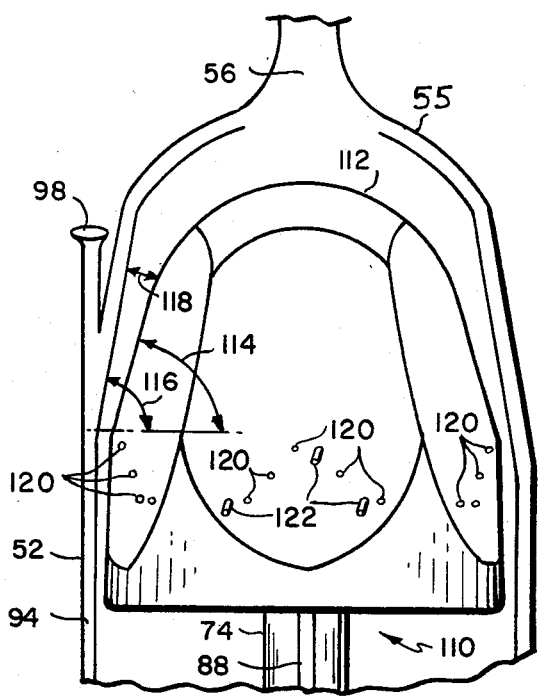
Figure 7:
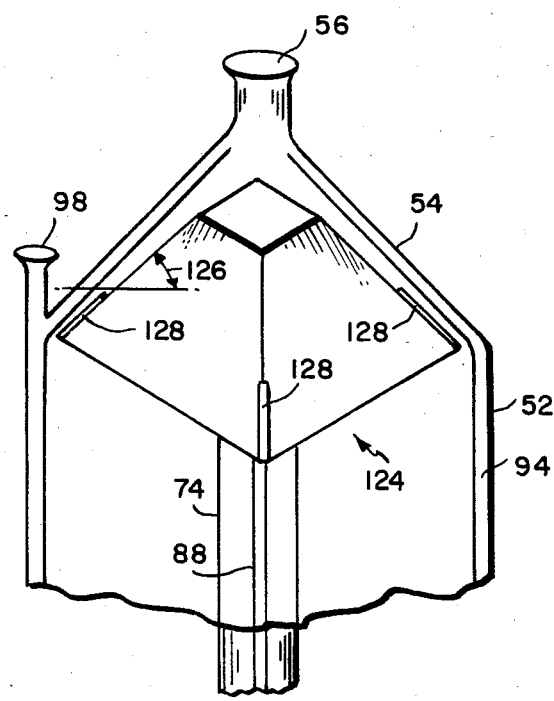

In the embodiments illustrated in FIGS. 5-7, only the upper portions of the improved reaction chamber 50 for CVD is illustrated, with the RF coils 90 also being omitted. As is evident from viewing these FIGS. 5-7, the design of the susceptor and the angle therebetween and the tapered top 54 of the tube 52 are different from one another as well as from the design illustrated in and described with reference to FIG. 2 above.

In the embodiment shown in FIG. 5, a tapered susceptor 100 of frusto-conical shape is disclosed. The susceptor 100 also is designed with an angle 102 which is different from the angle 72 of the susceptor 66, and is in fact somewhat larger than the angle 72. Consequently, an angle 104 between the tapered top 54 and the susceptor 100 is narrower than in the embodiment of FIG. 2, unless of course the angle 70 also is correspondingly increased.

In the embodiment shown in FIG. 6, a tapered susceptor 110 of yet a different shape and design is illustrated. The tapered susceptor 110 is of a five-sided design of planar side surfaces, with each of the five sides being oval-shaped, however. In addition, the top of the susceptor 110 is domeshaped 112, as opposed to being flat as in the previous two designs, and the angle 114 also is larger than those of the previous designs. Due to this increased angle 114, a somewhat differently shaped tapered top 55 of the reaction tube 52 also is formed with a larger angle 116. Consequently, the angle 118 between the tapered top 55 and the tapered susceptor 110 also is affected. Each of the five flat, oval-shaped side surfaces of the susceptor 110 preferably is provided with a plurality of holes 120. The holes 120 are designed removably to accommodate therein a plurality of pins 122. These pins 122 and their respective selected locations among the holes 120 are provided as supports for different sized and shaped substrates, not shown, on the oval-shaped surfaces of the susceptor 110. It is on the substrates of various sizes and shapes that films are grown from the several metalorganic compounds in the reaction tube 52.

In the embodiment shown in FIG. 7, a tapered susceptor 124 shaped as a four sided frusto-pyramid is illustrated. Its preferred angle 126 is about midway of that of the susceptors described above, i.e., about 45°. The tapered susceptor 124 also is illustrated with a number of shallow recesses 128 designed for locating a corresponding number of substrates therein.

THE EMBODIMENT SHOWN IN FIG. 8

In the embodiments shown in and described with reference to FIGS. 2, 5 and 7, the tapered top 54 of the reaction tube 52 is conical in shape, albeit its respective angle of taper may differ. Further, the reaction tube 52 preferably is cylindrical in configuration, and the tapered susceptors all have been rotatably mounted therein.

Figure 8:
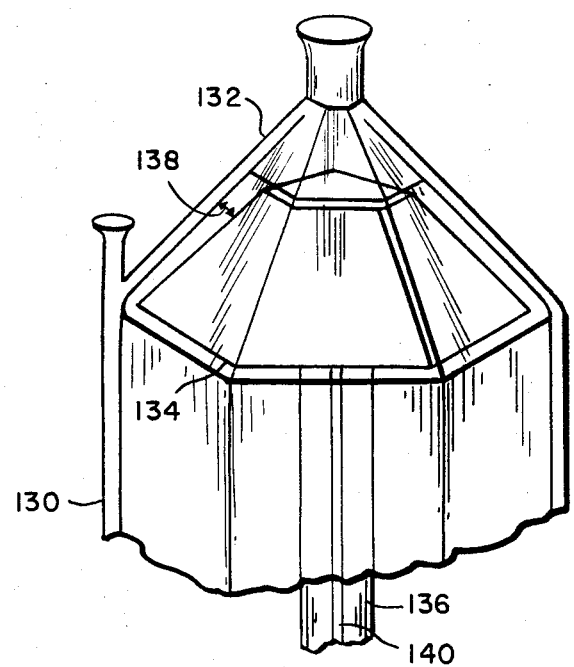

In contrast to the above, in the embodiment shown in FIG. 8, a vertical reaction tube 130 having a tapered top 132 of pyramidal shape is illustrated. The illustrated tapered top 132 has five planar side surfaces. It can also be shaped with four or with more than five sides. Likewise, a tapered susceptor 134 of like pyramidal shape and also having five planar side surfaces is shown. Preferably, in this configuration the tapered susceptor 134 is not mounted for rotation on a hollow rod 136 so as to allow for an optimum angle 138 to exist between the tapered top 132 and the tapered susceptor 134. Should rotation of the susceptor 134 nevertheless be preferred so as further to enhance the uniformity of growth from the metalorganic compounds, such rotation can be achieved provided the susceptor 134 is lowered away sufficiently from the tapered top 132 so as to provide the necessary clearance therebetween. The hollow rod 136 also is provided with a thermocouple 140 as hereinbefore. Further, the reaction tube 130 also is double-walled and is provided with the necessary RF coil, not shown, to heat the susceptor 134.

Thus it has been shown and described an improved CVD reaction chamber 12 designed for the chemical vapor deposition from organometallic compounds, which reaction chamber 12 satisfies the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:
1. A reaction chamber for CVD comprising:
  (a) a vertical reaction tube having a tapered top provided with a concentric gas inlet and a bottom provided with a gas outlet;
  (b) a base plate for supporting said vertical reaction tube;
  (c) means for cooling said vertical reaction tube and said base plate;
  (d) a tapered susceptor mounted in operative association within said tapered top of said tube;
  (e) said tapered top of said tube and said tapered susceptor defining an angle therebetween;
  (f) said tapered top of said tube being conical in shape and said tapered susceptor being frusto-conical in shape;
  (g) means for rotatably and replaceably mounting said susceptor within said tapered top of said tube, said vertical reaction tube being provided with a double wall along its axial length and along a contiguous portion of said tapered top, said double wall having an inlet and an outlet and designed to accommodate a liquid coolant therein;

(h) said rotatably and replaceably mounting means being a hollow rod extending through said bottom of said tube; and (i) means for monitoring both the temperature and the pressure within said tube.

2. A reaction chamber for CVD comprising:

(a) a vertical reaction tube having a tapered top provided with a concentric gas inlet and a bottom provided with a gas outlet;

(b) a base plate for supporting said vertical reaction tube;

(c) means for cooling said vertical reaction tube and said base plate;

(d) a tapered susceptor mounted in operative association within said tapered top of said tube;

(e) said tapered top of said tube and said tapered susceptor defining an angle therebetween;

(f) said tapered top of said tube being conical in shape and said tapered susceptor being pyramidal in shape;

(g) means for rotatably and replaceably mounting said susceptor within said tapered top of said tube, said vertical reaction tube being provided with a double wall along its axial length and along a contiguous portion of said tapered top, said double wall having an inlet and an outlet and designed to accommodate a liquid coolant therein;

(h) said rotatably and replaceably mounting means being a hollow rod extending through said bottom of said tube; and (i) means for monitoring both the temperature and the pressure within said tube.

3. The reaction chamber of claim 2 wherein said pyramidal susceptor has a plurality of planar side surfaces, ranging in numbers from four to twelve of said surfaces, and wherein each of said plurality of planar side surfaces of said pyramidal susceptor is provided with a plurality of holes, said plurality of holes designed selectively to accommodate therein a plurality of pins.

4. The reaction chamber of claim 1 wherein said temperature monitoring means is a thermocouple, said reaction chamber further including means for hermetically sealing off said vertical reaction tube.

5. The reaction chamber of claim 8 wherein each of said plurality of planar side surfaces is oval shaped.

6. The reaction chamber of claim 1 wherein said tapered top of said tube defines a first angle from the horizontal which ranges from forty degrees to eighty degrees, and wherein said tapered susceptor defines a second angle from the horizontal which ranges from thirty-eight degrees to seventy-eight degrees, with said first angle exceeding said second angle.

7. The reaction chamber of claim 6 wherein the differences between said first and second angles define a third angle ranging from zero to nineteen degrees.

8. A reaction chamber for CVD comprising:

(a) a vertical reaction tube having a tapered top provided with a concentric gas inlet and a bottom provided with a gas outlet;

(b) a base plate for supporting said vertical reaction tube;

(c) means for cooling said vertical reaction tube and said base plate;

(d) a tapered susceptor mounted in operative association within said tapered top of said tube;

(e) said tapered top of said tube and said tapered susceptor defining an angle therebetween, said angle being between zero to nineteen degrees;

(f) both said tapered top of said tube and said tapered susceptor being pyramidal in shape;

(g) means for rotatably and replaceably mounting said susceptor within said tapered top of said tube, said vertical reaction tube being provided with a double wall along its axial length and along a contiguous portion of said tapered top, said double wall having an inlet and an outlet and designed to accommodate a liquid coolant therein;

(h) said rotatably and replaceably mounting means being a hollow rod extending through said bottom of said tube; and (i) means for monitoring both the temperature and the pressure within said tube.

9. The reaction chamber of claim 8 wherein said pyramidal shaped tapered top and tapered susceptor have a plurality of like number of planar side surfaces, ranging in numbers from about four to twelve of said surfaces.

* * * * *